United States Patent [19]
Cathey

[11] Patent Number: 5,342,477
[45] Date of Patent: Aug. 30, 1994

[54] LOW RESISTANCE ELECTRODES USEFUL IN FLAT PANEL DISPLAYS

[75] Inventor: David A. Cathey, Boise, Id.

[73] Assignee: Micron Display Technology, Inc., Boise, Id.

[21] Appl. No.: 92,311

[22] Filed: Jul. 14, 1993

[51] Int. Cl.$^5$ .......................... B44C 1/22; C23F 1/00
[52] U.S. Cl. .................... 156/643; 156/656; 156/657; 156/667; 437/181
[58] Field of Search ............... 156/643, 652, 656, 657, 156/662, 667, 659.1; 437/181; 359/54, 61, 79, 81, 87

[56] References Cited

U.S. PATENT DOCUMENTS

| | | | |
|---|---|---|---|
| 4,006,383 | 2/1977 | Luo et al. | 315/169 |
| 4,042,854 | 8/1977 | Luo et al. | 315/169 |
| 4,114,070 | 9/1978 | Asars | 315/169 |
| 4,670,097 | 6/1987 | Abdalla et al. | 156/667 |
| 4,986,876 | 1/1991 | Zeto et al. | 156/667 X |
| 5,246,468 | 9/1993 | Takahashi et al. | 437/181 X |

OTHER PUBLICATIONS

Liu et al., "Conductivity Enhancement of Transparent Electrode by Side-Wall Copper Electroplating", SID 93 Digest, pp. 554–570.

Mueller et al., "Tiling Thin-Film Electroluminescent Displays", SID 91 Digest, pp. 567–570.

Primary Examiner—William Powell
Attorney, Agent, or Firm—Lia M. Pappas

[57] ABSTRACT

A method is provided for fabricating a high resistance row (or column) electrode with which a low resistance runner is associated. The electrode is formed, preferably from a substantially transparent material, and a low resistant (i.e., highly conductive material) is disposed thereon. The highly conductive material is subsequently etched such that the highly conductive material remains along the sides of the electrode, thereby reducing the resistivity of the electrode.

19 Claims, 3 Drawing Sheets

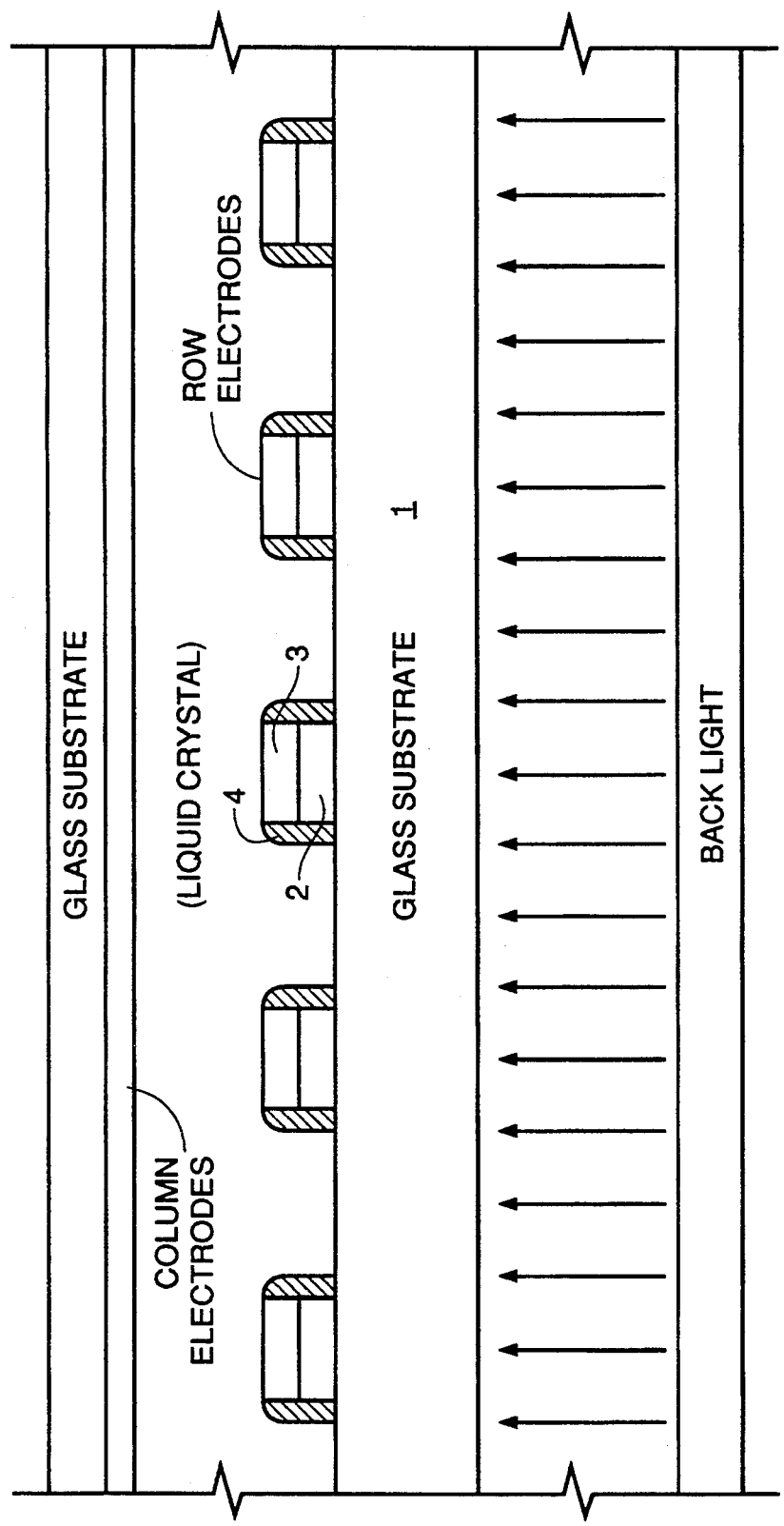

LOW RESISTANCE ELECTRODES USEFUL IN FLAT PANEL DISPLAYS

FIELD OF THE INVENTION

This invention relates to display devices, and more particularly to display devices employing at least one transparent electrode.

BACKGROUND OF THE INVENTION

Displays, such as those commonly used in lap-top computer screens, function as a result of energy or voltage responsive substances (whether liquid crystals, plasma, phosphors, or other material) disposed between electrodes. When the energy or voltage responsive substances are excited, they either permit light to pass through a transparent electrode and onto the viewer, or generate light which passes through a transparent electrode and onto the viewer.

Flat panel displays employ integrated circuit technology to create thin, high resolution displays wherein each pixel is activated by a set of electrodes. Flat panel display technology is becoming increasingly important in appliances requiring lightweight portable screens.

Liquid crystal displays (LCD), electroluminescent displays (EL), plasma displays, and electrochromic displays are among the devices using at least one transparent electrode at a pixel site. These displays employ orthogonal electrically conductive row and column electrodes in various ways to induce a visible pixel site to a viewer. The electrodes are commonly patterned, i.e., arranged in rows and columns. Energy or voltage responsive materials are disposed between the electrodes.

When a voltage is created between the electrodes, the materials respond, and light is transmitted toward the viewer. In order for light to pass through the electrode and onto the viewer, the row electrodes, the column electrodes, or both electrodes must be fabricated from a transparent material.

The transparent electrode material must also be electrically conductive, such as indium tin oxide. Unfortunately, the conductive materials which have transparent qualities, also tend to have high resistance values, as compared to opaque or reflective metallic conductors. The high resistance values tend to cause the display device to run at a slower rate and to consume more power. Display power consumption increases due to the resistance of the rows (or columns) increasing power losses. The rate of display operation is hampered due to an increase in the RC time constant of the rows or columns. Hence a low resistant electrode would improve the overall operation of the display.

Current methods of fabricating low resistance electrodes have several drawbacks. Some of the methods employ a photoetch step to accomplish the necessary patterning and etching of the electrodes. Since the process is not self-aligned, it is more difficult to control.

Other methods use electroplating to enhance the conductivity of the electrodes. See, for example, Liu, et al., "P-29: Conductivity Enhancement of Transparent Electrode by Side-wall Copper Electroplating."

SUMMARY OF THE INVENTION

The present invention is a method for fabricating a transparent row (or column) electrode, and associating it with a low resistance runner, thereby enhancing the conductivity of the electrode.

The electrode is formed, preferably from a substantially transparent material, and a low resistant (i.e., highly conductive material) is disposed thereon. The highly conductive material is subsequently etched such that the conductive material remains along the sides of the electrode.

The electrode may be disposed directly on a substrate, or alternatively, on one or more insulating or conductive layers. In a further embodiment, an energy or voltage responsive material (i.e., phosphors, liquid crystals, plasma, etc) is disposed between the electrode and the substrate.

BRIEF DESCRIPTION OF THE DRAWINGS

The present invention will be better understood from reading the following description of nonlimitative embodiments, with reference to the attached drawings, wherein:

FIG. 7 is a schematic cross-section of a liquid crystal display device demonstrating an application for the present invention.

DETAILED DESCRIPTION OF THE INVENTION

For ease of discussion, the present invention will be described with reference to an electroluminescent display. However, one having ordinary skill in the art, upon being apprised of the present invention, would be able to understand the application of the invention to other displays employing at least one transparent electrode. The operation of electroluminescent displays is well known, and therefore will not be discussed. See, for example, U.S. Pat. Nos. 4,006,383; 4,042,854; and 4,114,070.

Figure 1:
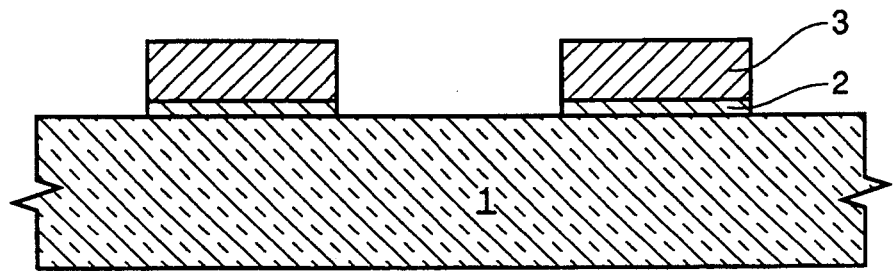
FIG. 1 is a schematic cross-section of the preferred embodiment of the present invention, wherein an additional insulating layer is patterned superjacent electrodes.

As shown in FIG. 1, a row (or column) electrode 2 is fabricated from a conductive transparent material, such as: indium tin oxide or tin oxide, and has a transparent insulating material 3, such as silicon dioxide, disposed thereon. Tantalum oxide and salicided materials can also be used to form the insulating material 3.

If the electrodes 2 are not fabricated from a substantially transparent material, large portions of the electrodes 2 should still be substantially transparent.

One advantage of the use of a silicon dioxide layer 3 according to the present invention is the increase in the height of the stack for practical formation of etched spacers 4. If the stack which is to be etched is higher, there is more flexibility in terms of the etch parameters, particularly etch uniformity, and degree of overetch. The electrodes 2 have a height substantially within the range of 1000Å–5000Å.

Figure 5:
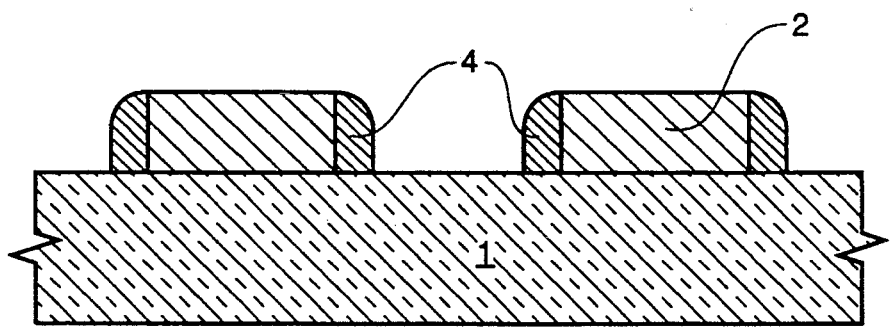
FIG. 5 is a schematic cross-section of an alternative embodiment of the present invention, without additional insulating layers.

In an alternative embodiment, see for example FIG. 5, the transparent silicon dioxide layer 3 is not used. In such a case, the etch step becomes more difficult because the conductive transparent electrode 2 is usually very small, and may be eroded during the overetch portion of the etch step. The insulating layer 3 lends more leeway to the etch step, and thereby makes the process of the present invention more commercially practical.

The substrate 1 can be any of a variety of materials known in the art, and the selection of the substrate 1 may be related to cost, as well as to the type of display being fabricated. A common material is a glass, such as for example, Corning 7059 or Sodaline Float Glass, which glass may be blackened or doped, or otherwise treated.

Figure 4:
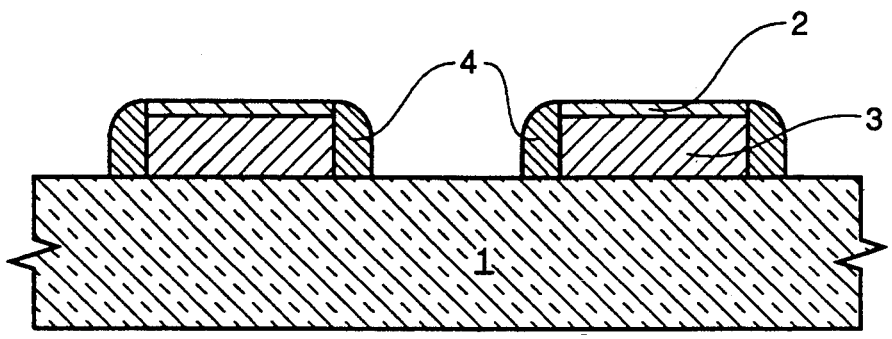
FIG. 4 is a schematic cross-section of an alternative embodiment of the present invention, wherein an additional insulating layer is disposed subjacent the electrodes.
Figure 6:
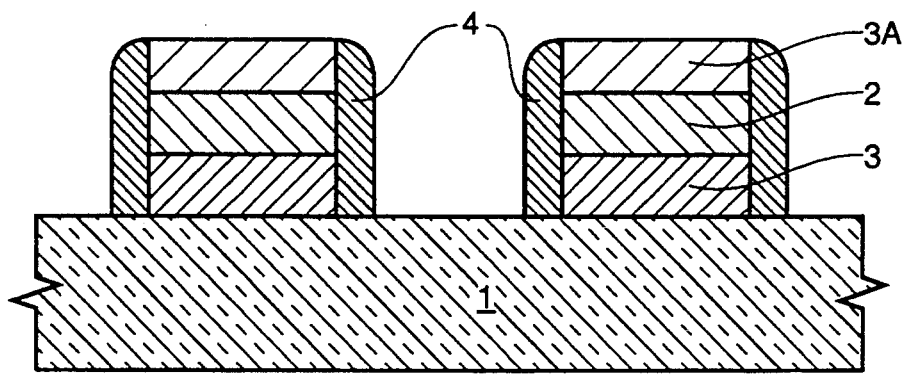
FIG. 6 is a schematic cross-section of an alternative embodiment of the present invention, wherein additional insulating layers are disposed above and below the electrodes.

The embodiments described herein also have an insulating layer 3 disposed between the substrate 1 and the electrode 2. The embodiment of FIG. 6 has another additional insulating layer 3 disposed subjacent the electrode 2, as well as an insulating layer 3A superjacent the electrodes 2. The embodiment of FIG. 4 depicts electrodes 2 with an insulating layer 3 disposed subjacent the electrodes 2.

The insulating layer 3 is also preferably formed from a transparent material, such as silicon dioxide, tantalum oxide or a salicided material.

Depending on the display, there may be other insulating layers, as well as conductive layers disposed between the electrode 2 and the substrate 1. Additionally, there may be energy responsive elements or materials (e.g., plasma, liquid crystals, phosphors, etc.) disposed between the electrodes 2 and the substrate 1. Other embodiments (not shown) may locate the electrodes 2 directly on the substrate 1.

Figure 2:
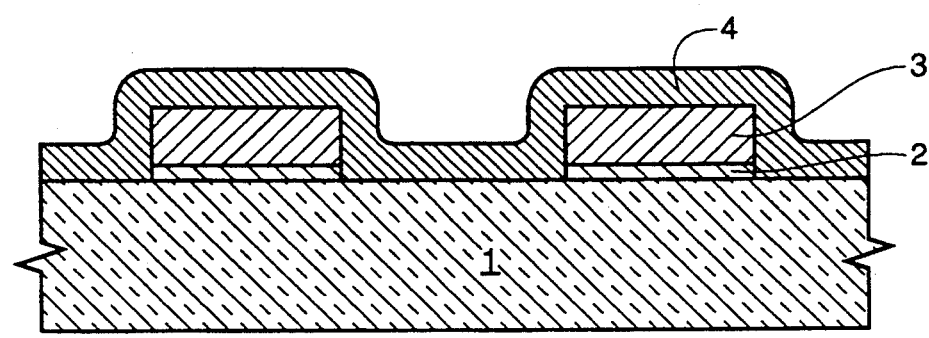
FIG. 2 is a schematic cross-section of the electrodes of FIG. 1, with the low resistance material disposed thereon.

Illustrated in FIG. 2 is the low resistance material 4 disposed on the row electrode 2 and along the surface of the substrate 1. The low resistive conductive material 4 may be a laser ablated, chemical vapor deposited (CVD), evaporated, or sputtered metal film, or other suitable conductive material. Additionally, a protective overcoat film (not shown) may be applied to prevent subsequent lateral etching of the low resistive film 4 during the spacer etch.

Figure 3:
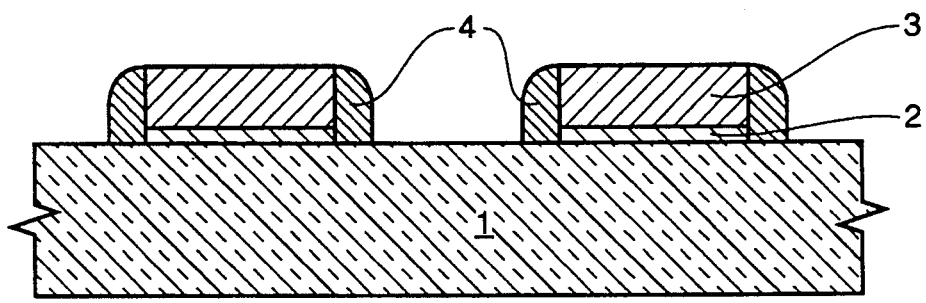
FIG. 3 is a schematic cross-section of the electrodes of FIG. 2, after the low resistance material has been anisotropically etched according to the process of the present invention, thereby creating spacers along the electrodes.

FIG. 3 depicts the row electrodes 2 after the low resistive conductive material 4 has been etched. Spacers 4 are left behind, which spacers 4 run the length of the row electrodes 2. The low resistive conductive material 4 is preferably etched using a reactive ion etch, but any other suitable etch known in the art may also be used.

FIG. 7 serves as an illustrative example of the present invention disposed in a display. In this particular example, the display employs liquid crystals. However, the present invention is equally suited for use in other displays employing a transparent electrode. The high resistant row electrodes contain a transparent insulator 3 and an indium tin oxide layer 2, as well as the spacer structures 4 of the present invention.

The viewer watches the display through the glass screen to which is attached the transparent column electrode. The liquid crystals are disposed between the column electrode and the row electrodes fabricated according to the process of the present invention. The row electrodes are also disposed on a substrate, in this example, the substrate 1 is glass. A liquid crystal display is illuminated from behind the electrodes, hence the terms "backlit" and "backlight."

While the particular low resistive electrode for use in flat panel displays as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, although the preferred embodiment is described with reference to passive matrix LCD's, one with ordinary skill in the art would understand that the present invention could be applied to other display technologies which employ orthogonal electrically conductive row and column electrodes to induce a visible pixel site to a viewer, such as for example, a plasma display, electroluminescent or electrochromic display.

I claim:

1. A method to form low resistance electrodes, the method comprising the following steps of:
    patterning an electrode superjacent a substrate, said electrode having a length; and
    disposing a low resistant material along said length of said electrode, said electrode and said low resistant material being combined with a substantially transparent conductive material in a flat panel display, said conductive material having a high resistance.

2. A method to form low resistance electrodes, the method comprising the following steps of:
    patterning an electrode superjacent a substrate, said electrode having a length;
    disposing a low resistant material along said length of said electrode; and
    disposing an insulating layer superjacent said electrode.

3. The method according to claim 2, wherein said insulating layer is substantially transparent.

4. The method according to claim 1, wherein said low resistant material is disposed by the following steps comprising:
    depositing said low resistant material; and
    selectively removing said low resistant material.

5. The method according to claim 4, wherein said low resistant material comprises at least one of doped silicon, tantalum oxide, and a salicided material.

6. A process for fabricating a substantially transparent electrode, said process comprising the following steps of:
    forming an electrode from a substantially transparent material;
    patterning a substantially transparent insulating material superjacent said electrode;
    blanketing a low resistant material superjacent said electrode; and
    selectively removing said low resistant material, thereby leaving low resistant spacers along said electrode.

7. The process according to claim 6, wherein said electrode comprises at least one of indium tin oxide and tin oxide.

8. The process according to claim 7, wherein said insulating material comprises silicon dioxide.

9. The process according to claim 8, wherein said low resistant material is removed by etching, said insulating material protecting said electrode during said etch.

10. The process according to claim 9, wherein said electrode is disposed on a substrate, at least one insulating layer is disposed between said electrode and said substrate.

11. The process according to claim 9 wherein a conductive layer is disposed between said electrode and said substrate.

12. The process according to claim 9, wherein a light emitting source is disposed between said substrate and said electrode.

13. A process for enhancing the conductivity of an electrode, said process comprising the following steps of:
    disposing at least one insulating layer on a substrate;
    disposing an energy responsive layer on said substrate;
    fabricating a substantially transparent electrode on at least one of said layers; and
    fabricating a highly conductive runner along said transparent electrode.

14. The process according to claim 13, wherein said runner is fabricated by the following steps comprising:
    depositing a highly conductive material superjacent said electrode;
    selectively removing said highly conductive material, thereby forming said runner.

15. The process according to claim 14, wherein said electrode has a height substantially in the range of 1000Å–10000Å.

16. The process according to claim 15, wherein said runner comprises at least one of doped silicon, tantalum oxide, and a salicided material.

17. The process according to claim 16, wherein said electrode comprises at least one of indium tin oxide, and tin oxide.

18. The process according to claim 17, wherein said energy responsive layer comprises at least one of liquid crystals, plasma, and phosphors.

19. The process according to claim 18, wherein said electrode is used in a display, said display is at least one of a liquid crystal display, an electroluminescent display, a plasma display, and an electrochromic display.

* * * * *